United States Patent
Pearce et al.

(10) Patent No.: US 6,819,190 B2
(45) Date of Patent: Nov. 16, 2004

(54) ROBUST FRACTIONAL CLOCK-BASED PULSE GENERATOR FOR DIGITAL PULSE WIDTH MODULATOR

(75) Inventors: Lawrence G. Pearce, Palm Bay, FL (US); William David Bartlett, Melbourne Beach, FL (US)

(73) Assignee: Intersil Americas Inc., Milpitas, CA (US)

( * ) Notice: Subject to any disclaimer, the term of this patent is extended or adjusted under 35 U.S.C. 154(b) by 10 days.

(21) Appl. No.: 10/315,836

(22) Filed: Dec. 10, 2002

(65) Prior Publication Data

US 2004/0108913 A1 Jun. 10, 2004

(51) Int. Cl.[7] ............................................. H03B 27/00
(52) U.S. Cl. .................. 331/57; 331/185; 327/158; 327/159; 363/41
(58) Field of Search .................. 331/57, 185; 327/158, 327/159; 363/41

(56) References Cited

U.S. PATENT DOCUMENTS 5,596,302 A * 1/1997 Mastrocola et al. .......... 331/57
6,535,043 B2 * 3/2003 Chen ........................... 327/291

* cited by examiner

Primary Examiner—Arnold Kinkead
(74) Attorney, Agent, or Firm—Allen, Dyer, Doppelt, Milbrath & Gilchrist, P.A.

(57) ABSTRACT

A tapped delay line generates a fractional clock pulse signal for controlling a PWM pulse generator, such as used in a DC-DC converter. Operational parameters of the tapped delay are adjusted to maintain a desired fractional precision of the duty-cycle of the PWM clock pulse signal. In a first, phase locked loop (PLL) based embodiment, the tapped delay line-based digital PWM pulse generator includes a compensating phase locked-loop formed around an auxiliary tapped delay line that implements the voltage controlled oscillator of the PLL. In a second embodiment, the PWM pulse generator is configured as an 'open-loop' tapped delay line phase detector architecture, which avoids having to correlate parameters of the PLL delay line with those of the PWM delay line.

12 Claims, 3 Drawing Sheets

ROBUST FRACTIONAL CLOCK-BASED PULSE GENERATOR FOR DIGITAL PULSE WIDTH MODULATOR

FIELD OF THE INVENTION

The present invention relates in general to electronic circuits and components therefor, and is particularly directed to a new and improved fractional clock-based pulse generator for providing a robust pulse signal for controlling the duty-cycle of a digital pulse width modulator (PWM) circuit.

BACKGROUND OF THE INVENTION

Electrical power for an integrated circuit (IC) is typically supplied by one or more direct current power sources, such as a buck-mode, pulse width modulation (PWM) based, DC-DC converter of the type diagrammatically shown in FIG. 1. As shown therein, a controller 10 supplies a synchronous PWM signal to a driver 20, for controlling the turn-on and turn-off of a pair of electronic power switching devices, to which a powered load is coupled. In the illustrated DC-DC converter, the electronic power switching devices are depicted as an upper (or high side) power NMOSFET (or NFET) device 30, and a lower (or low side) power NFET device 40, having their drain-source current flow paths connected in series between a pair of power supply rails (e.g., VIN and ground (GND)).

The upper NFET device 30 is turned on and off by an upper gate switching signal UGATE applied to its gate from driver 20, while the lower NFET device 40 is turned on and off by a lower gate switching signal LGATE supplied from driver 20. A common node 35 between the two NFETs is coupled through an inductor 50 to a load reservoir capacitor 60 that is coupled to a reference voltage terminal (GND). The connection 55 between inductor 50 and capacitor 60 serves as an output node 55 from which a desired (regulated) DC output voltage VOUT is applied to a LOAD 65 (coupled to GND).

The output node connection 55 is also fed back to error amplifier circuitry 12 within the controller 10. The error amplifier circuitry is used to regulate the converter's output DC voltage relative to a reference voltage supply. In addition, the common node 35 between the controllably switched NFETs is coupled (by way of a feedback sense resistor 45) to current-sensing circuitry 15 within the controller 10. In response to the two feedback signals the controller adjusts duty ratio of the PWM signal, as necessary, to maintain the converter's DC output within a prescribed set of parameters.

The controller 10 of FIG. 1 can be implemented with either analog or digital circuits. The digital implementation is desirable for all the reasons that have historically favored digital signal processing techniques, but there is a penalty. A digital controller produces a quantized PWM pulse width, i.e., the PWM pulse width has an irreducible temporal granularity associated with the finite bit length of the digital implementation. The digital PWM granularity imposes performance limitations on the DC-DC regulator in a manner similar to noise in the analog PWM pulse generation. Electronic circuits and systems that are powered by PWM-based DC-DC converters of the type shown in FIG. 1 require precise DC-DC regulation, and the required precision of regulation is tightening with each successive generation of circuits and systems. Consequently, it is desirable to have high digital resolution (small temporal granularity) of the PWM pulse. Ostensibly, this may be accomplished by operating the digital PWM pulse generator at a clock frequency (the clock driving the digital circuitry and providing the smallest increments of time from which the PWM pulse is constructed) that is some large multiple of the fundamental switching frequency (the PWM pulse repetition frequency).

As a non-limiting example, consider the case of a switching frequency of 1 MHz, a digital clock frequency of 100 MHz, and a nominal PWM duty-cycle of 10%. The digital clock cycle resolution limits the actual duty-cycle to P/100, where P is an integer number of clock cycles that make up a single PWM pulse. This means that the duty-cycle resolution in the vicinity of the nominal value PWM duty-cycle of 10% is +/−1%, namely 9% or 11%. In either case the actual digital duty-cycle granularity is very coarse, +/−10% of the nominal value PWM duty-cycle.

One way to improve upon this relatively coarse digital resolution is to increase the ratio of the clock signal frequency to the switching frequency—either by decreasing the switching frequency and/or increasing the frequency of the clock signal. In the above example, a finer granularity/resolution on the order of 0.1% of the switching frequency could be obtained by decreasing the switching frequency to 100 KHz (while maintaining the clock frequency at 100 MHz), or increasing the clock frequency to 1 GHz (while maintaining the switching frequency at 1 MHz). Unfortunately, both choices obviously result in impractical solutions in light of other system requirements and limitations.

A more practical way is to employ a tapped delay line-based digital PWM pulse generator of the type shown in FIG. 2, an associated timing diagram for which is presented in FIG. 3. As shown therein, an Integer PWM Pulse that encompasses a prescribed number P of clock cycles of a reference clock signal CLOCK is applied to a multistage tapped delay line 200 containing a plurality of cascaded delay stages 200-1, 200-2, . . . , 200-N (each of which may be comprised of a pair of (MOSFET) inverter stages). Each delay stage corresponds to the minimum time resolution or granularity by which the Integer PWM Pulse may be adjusted. The delay of each of the delay stages 200-j is a specific fraction of the CLOCK signal period from which the Integer PWM pulse was constructed as an integer number P of CLOCK cycles. Ideally, for N stages of delay, each stage should provide a delay of 1/(N+1) of the CLOCK signal period.

The output of each delay stage is coupled to a respective input of an N+1:1 signal selector 210, the output of which is coupled to one input of an OR gate 220. A second input of the OR gate 220 is coupled to receive the Integer PWM Pulse. Thus, OR gate 220 will logically OR the Integer PWM Pulse with the output of whichever delay stage 200-j is selected in accordance with a fractional delay select signal coupled to the select input 212 of signal selector 210.

Depending upon the fractional delay Di imparted by each delay stage, and depending upon which jth one of its inputs is selected, signal selector 210 will produce a version of the Integer PWM Pulse delayed by jxDi referred to as the Delayed Integer PWM Pulse. Logically ORing the Integer PWM Pulse and the Delayed Integer PWM Pulse produces a Non-Integer PWM Pulse having a front edge (e.g., rising edge) 301 that is coincident with the front edge (e.g., rising edge) 311 of the Integer PWM Pulse and a termination (e.g., falling edge) 302 that is coincident with the termination (e.g., falling edge) 312 of the Delayed Integer PWM Pulse.

Now although the fractional delay scheme of FIG. 2 provides a potentially effective solution to the PWM digital resolution problem, it is limited by practical considerations, such as differences among fabrication runs of its integrated circuit manufacturing process, and operational variations, such as changes in temperature and supply voltage.

SUMMARY OF THE INVENTION

In accordance with the present invention, shortcomings of conventional approaches for generating a fractional clock pulse signal for a PWM pulse generator are effectively obviated by a tapped delay line-based, fractional clock pulse generator, operational parameters of which are adjusted as necessary to maintain a desired fractional precision of the duty-cycle of a generated PWM clock pulse signal. Pursuant to a first, phase locked loop (PLL)-based embodiment of the invention, the tapped delay line-based digital PWM pulse generator of FIG. 2 is augmented to include a compensating phase locked-loop, that is formed around an auxiliary tapped delay line used to implement a voltage controlled oscillator of the PLL. In accordance with a second embodiment of the invention, the PWM pulse generator is configured as a 'pseudo PLL'-type, open-loop tapped delay line architecture.

In the first (PLL) embodiment, represented in FIG. 4, one or more parameters of the respective stages of an auxiliary, multistage, delay line-configured ring oscillator have a predetermined relationship with respect to those of the PWM tapped delay line, based upon desired operating conditions of the PWM pulse generator, as well as desired performance of the PLL, whereby parameters of the delay stages of the auxiliary, multistage delay line of the PLL are appropriately correlated with those of the PWM tapped delay line. As a result, a common operational adjustment parameter (e.g., delay stage bias voltage) is able to produce slightly different delays in the two respective delay lines having a prescribed correlation by design.

Any phase error between a reference clock signal CLOCK and the 'clock' signal generated by the multistage, delay line-configured ring oscillator causes a bias control unit to adjust the bias voltage applied to both delay lines. Since the respective delays imparted by the delay line stages of the auxiliary, multistage delay line of the PLL's ring oscillator are appropriately correlated with those of the delay stages of the PWM tapped pulse delay line, then whatever adjustment is carried out by the PLL bias control to lock its multistage delay line ring oscillator (VCO) to the reference clock signal will produce a corresponding adjustment of the individual delays of the delay line stages of the PWM pulse generator. This produces a high precision fractional adjustment of the duty-cycle of the PWM pulse produced by the output OR gate that is effectively independent of processing variations and operational parameters such as temperature and supply voltage.

In the open-loop 'pseudo PLL'-type tapped delay line architecture of the second embodiment, represented in FIG. 5 and associated with the timing diagram in FIG. 6, the Integer PWM Pulse is applied to the input of a multistage tapped delay line, the number of stages of which determines the resolution, or granularity, to which the system clock signal will be divided, and nominally encompasses one cycle of the system clock signal. The Integer PWM Pulse is also input to a register delay that imparts a single system clock period delay to the Integer PWM Pulse producing the Unity Delayed Integer PWM Pulse. The Unity Delayed Integer PWM Pulse and the output of the Nth delay stage are coupled the inputs of a phase detector, the output of which is coupled to a delay stage adjustment circuit such as a bias voltage generator. No delay stage of the tapped delay line has its output fed back to the delay line input stage, so that the second embodiment may be considered an open-loop 'pseudo PLL'-type tapped delay line.

The input (or simply a logic 0 signal) and the first N−1 outputs of the N delay stages of the multistage delay line are coupled to respective inputs of an N:1 signal selector whose output is coupled to an OR gate, as in the first embodiment. A second input of the OR gate is coupled to receive the Integer PWM Pulse. As in the first embodiment, the OR gate logically OR's the Integer PWM Pulse with the output of a selected delay stage of the delay line. The output of the OR gate produces the Non-Integer PWM Pulse whose leading edge is coincident with the leading edge of the Integer PWM Pulse and whose trailing edge is coincident with the trailing edge of the output of the selected delay stage.

As in the first embodiment, the output of the phase detector provides a phase error signal that is used to adjust the operation of each of the delay stages of the tapped delay line. In the second embodiment, however, rather than being referenced to the high frequency digital system clock, as in the first embodiment, the phase detector is referenced to the Unity Delayed Integer PWM Pulse that derived from the Integer PWM Pulse supplied directly to the delay line. The duration of the PWM output pulse is thereby determined by the delay granularity imparted by a respective one of the delay line stages and from which delay line stage output the Delayed Integer PWM Pulse signal is derived.

In operation, phase error between the Unity Delayed Integer PWM Pulse and the N stage delayed Integer PWM Pulse signal will cause the bias control unit to adjust its output or bias voltage. As this bias voltage is coupled to each of the delay stages of the tapped delay line, the amount of delay imparted by each delay stage will be appropriately adjusted, so that the intended fractional clock delay adjustment of the duty-cycle of the Integer PWM Pulse signal will be maintained effectively independent of processing variations and operational parameters.

DETAILED DESCRIPTION

Figure 1:
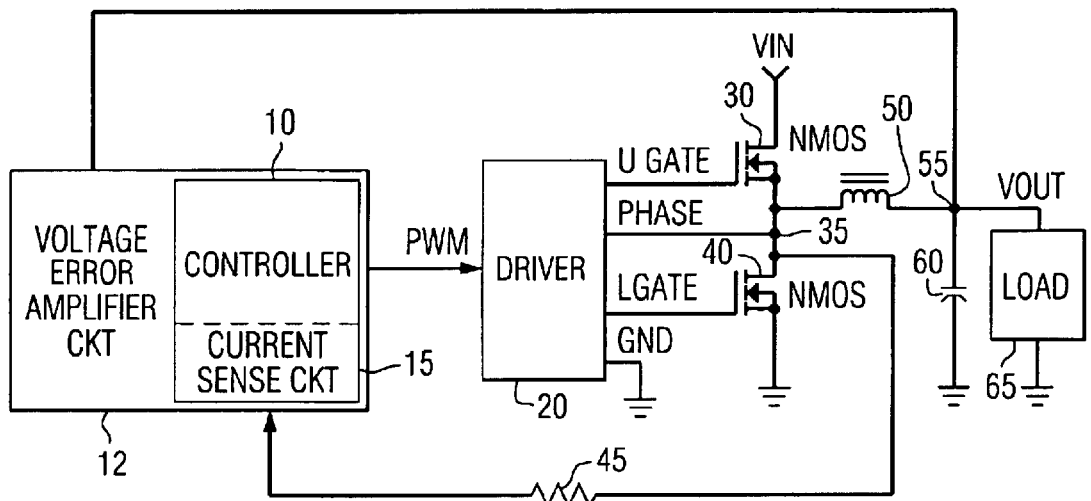
FIG. 1 diagrammatically illustrates a conventional buck-mode, pulse width modulation (PWM) based, DC-DC converter.

Before detailing the fractional clock-based pulse generator of the present invention, it should be observed that the invention resides primarily in a prescribed arrangement of conventional digital and analog circuits and components.

Consequently, the configuration of such circuits and components have, for the most part, been shown in the drawings by readily understandable block diagrams which show only those specific details that are pertinent to the present invention, so as not to obscure the disclosure with details which will be readily apparent to those skilled in the art having the benefit of the description herein. Thus, the block diagrams of the Figures are primarily intended to show the major components of the invention in convenient functional groupings, whereby the present invention may be more readily understood.

Figure 2:
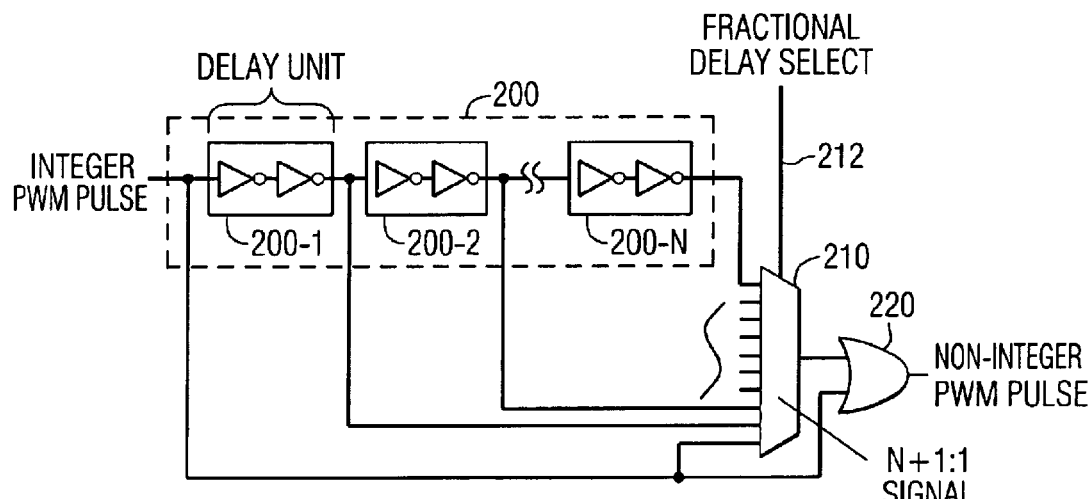
FIG. 2 diagrammatically illustrates a conventional tapped delay line-based digital PWM pulse generator.
Figure 3:
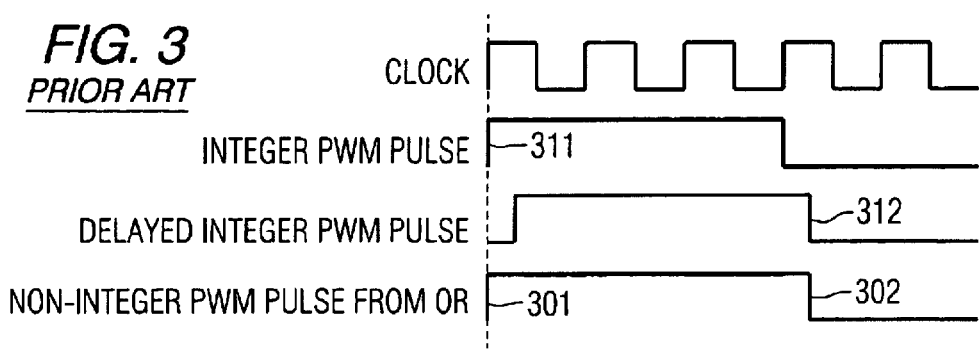
FIG. 3 is timing diagram associated with the tapped delay line-based digital PWM pulse generator of FIG. 2.
Figure 4:
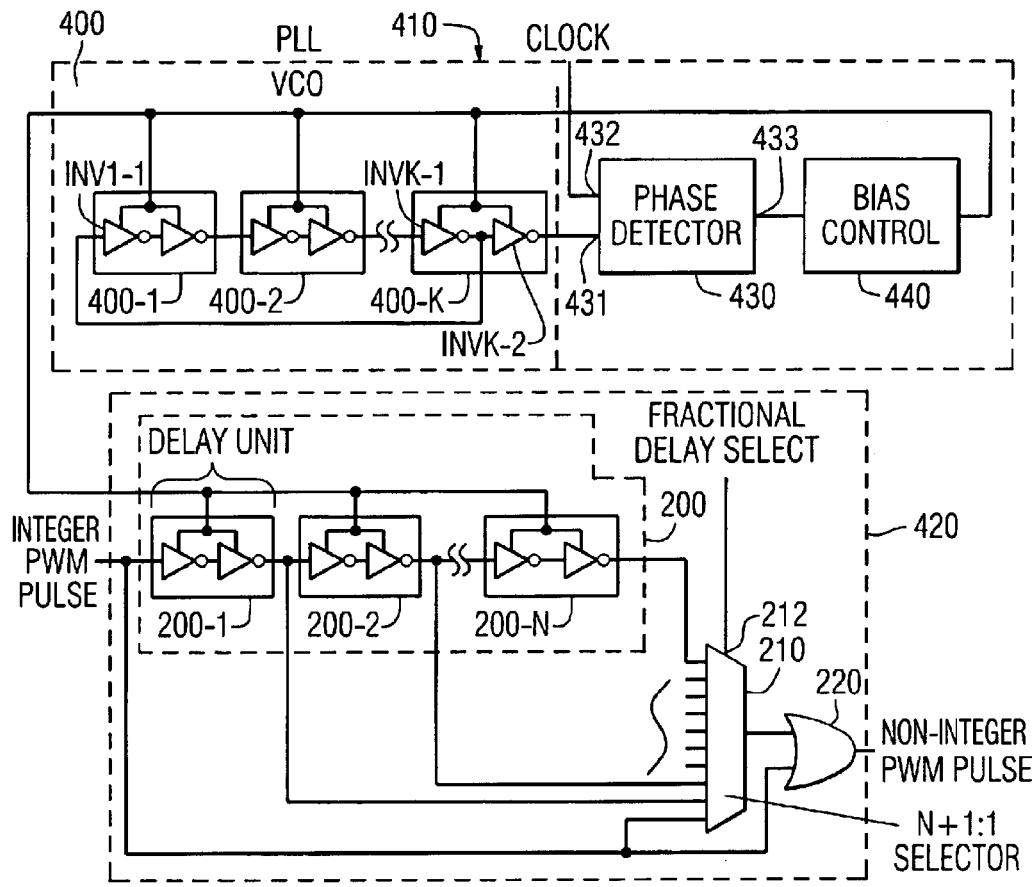
FIG. 4 diagrammatically illustrates a closed loop (PLL-based) tapped delay line-configured digital PWM pulse generator in accordance with a first embodiment of the invention.

Attention is now directed to FIG. 4, which shows a first, closed-loop, embodiment of the present invention, in which the tapped delay line-based digital PWM pulse generator of FIG. 2, described above, is augmented to include a compensating phase locked-loop formed around an auxiliary tapped delay line 400, which implements the voltage controlled oscillator (VCO) component of a PLL 410. One or more parameters (e.g., layout geometries) of the respective delay line stages of the auxiliary delay line 400 have a predetermined relationship with respect to those of the PWM delay line 200, based upon the desired operating characteristics of the PWM pulse generator, as well as desired performance of the PLL.

On the one hand, in order to facilitate digital processing applications, it is desired that the granularity of the duty-cycle of the PWM pulse be readily binarily adjustable (e.g., by one-sixteenth of a clock cycle). On the other hand, it is desired that the number of inverting delay elements in the PLL VCO 400 be a prime number (e.g., seventeen such that each delay is nominally one-seventeenth of a clock cycle) in order to prevent the generation of harmonics in the PLL. Consequently, properties of the delay stages of the auxiliary delay line 400 of the PLL must be appropriately correlated with those of PWM delay line 200, so that the same operational adjustment parameter (e.g., bias voltage) can be used to produce slightly different delays in the respective stages of the two delay lines. This may be readily achieved, for example, by appropriately establishing the parameters of the mask set that defines the ratio of the respective geometry layouts of the two sets of gates of which the delay line stages 200 and 400 are fabricated in a common integrated circuit substrate.

In the embodiment of FIG. 4, the PLL is shown as surrounded by broken lines 410, while the PWM pulse generator is shown as surrounded by broken lines 420. Except for its PLL control inputs, the PWM pulse generator 420 is identical to that of FIG. 2, so that a description of the same will not be repeated. Thus, within the PLL-based augmentation of the embodiment of FIG. 4, the auxiliary tapped delay line 400 includes a plurality of cascaded delay line stages 400-1, 400-2 . . . , 400-K, the number and configuration of each of which correspond to those of tapped delay line 200, so that auxiliary tapped delay line 400 may be considered to be an effective 'copy' of the tapped delay line 200.

In order to provide the functionality of a VCO, whose output frequency is typically (but not necessarily) that of a reference clock signal CLOCK (which is typically at least an order of magnitude greater than the frequency of the PWM switching signal), the output of a first inverter INVK-1 of the Kth delay stage 400-K of delay line 400 is fed back to the input of the first inverter INV1-1 of its first delay stage 400-1. This forms what is commonly referred to as a 'ring'-configured, delay stage-based oscillator, which produces an output clock frequency to which the PLL can lock to the input reference clock signal CLOCK entering the phase detector at 432.

For example, consider the case where K, the number of delay stages in the PLL VCO loop 400, is nine, and N, the number of delay stages in the PWM delay chain 200, is seven. The value of nine selected for K provides a prime number (seventeen) of inverter stages in the closed ring of the VCO (from INV1-1 through INVK-1), as is the preferred implementation as described previously. When the PLL is locked, each PLL inverter INVk-j provides a delay of one-seventeenth of a system clock cycle. The value seven for N allows division of a system clock cycle into eighths of a CLOCK cycle (zero to seven delay units). To provide the desired one-eighth clock cycle delay, the delay of each PWM delay line inverter INVn-j must be one-sixteenth of a system clock cycle. Hence the required ratio of the delay of the nominal PLL inverter to the delay of the nominal PWM inverter is sixteen-seventeenths. The output of a second inverter INVK-2 of the Kth delay stage 400-K is coupled to a first input 431 of a phase detector 430, which has a second input 432 thereof coupled to receive the clock signal CLOCK.

As in the case of a conventional PLL, the output 433 of the phase detector 430 provides a phase error signal that is used to adjust the operation of the tapped delay line-implemented VCO 400. As a non-limiting example, this phase error adjustment path is shown as comprising a bias voltage control unit 440, which controls the DC bias voltage applied to each of the delay stages of the delay line VCO 400. Pursuant to the present invention, the output of the bias voltage control unit 440 is simultaneously used to control the DC bias voltage that is applied to each of the delay stages of the tapped delay line 200 within PWM pulse generator 420.

In operation, any phase error between the reference clock signal CLOCK and the 'clock' generated by the tapped delay line VCO 400, as produced by the phase detector 430, will cause the bias control unit 440 to adjust the bias voltage applied to each of the inverter pairs of the delay stages 400-1, 400-2, 400-K of delay line 400. It will also simultaneously adjust the bias voltage applied to each of the inverter pairs of the delay stages 200-1, 200-2, . . . , 200-N of the tapped delay line 200 within the PWM pulse generator 420.

Since the respective delays imparted by the delay line stages of the auxiliary delay line 400 are appropriately correlated with those of the delay stages of the tapped delay line 200, as described above, then whatever adjustment is carried out in the PLL 410 to lock its tapped delay line (VCO) 400 to the reference CLOCK causes an appropriate adjustment of the delays of the delay line stages of the PWM pulse generator 420, and thereby provides a high precision fractional adjustment of the duty-cycle of the Integer PWM Pulse that is effectively independent of processing variations and operational parameters such as temperature and supply voltage.

Figure 5:
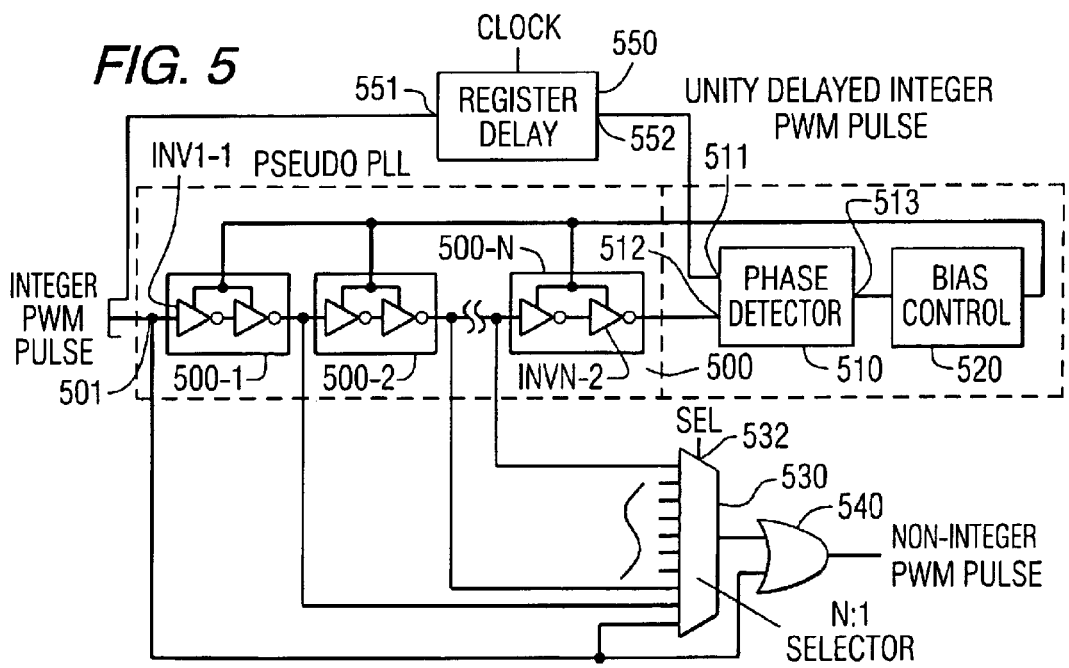
FIG. 5 diagrammatically illustrates an open loop tapped delay line-configured digital PWM pulse generator in accordance with a second embodiment of the invention.
Figure 6:
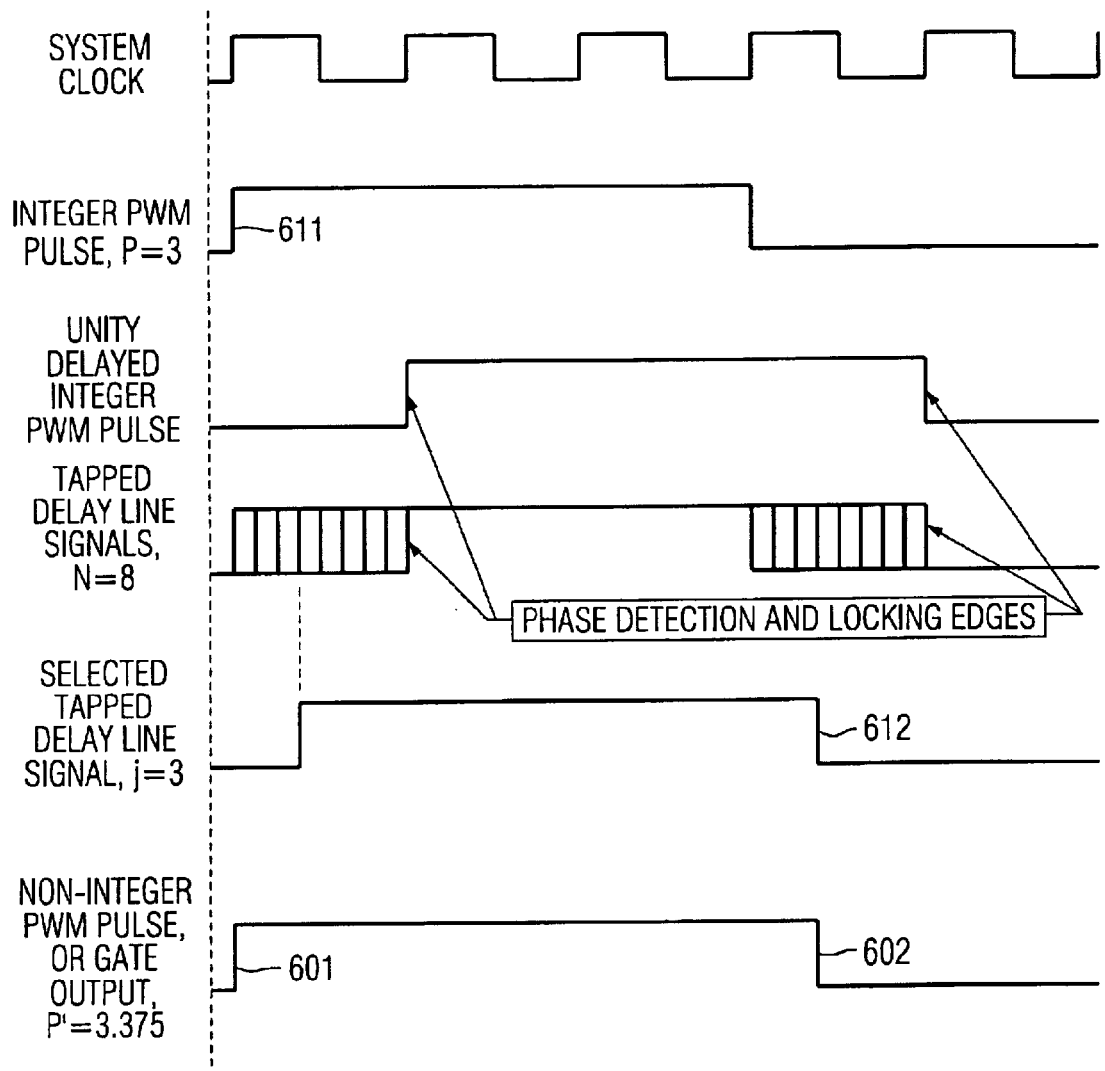
FIG. 6 is timing diagram associated with the open loop tapped delay line-configured digital PWM pulse generator of FIG. 5.

As just described, because the first embodiment of the invention uses a PLL-based delay line, which is prime number adjustment-based, to set the parameters of the PWM delay line, which is binary number adjustment-based, it is necessary to appropriately ratio or correlate the respective delays of the delay stages of the two (PLL and PWM) delay lines, in order to allow adjustment of the duty-cycle of the PWM delay line stage by means of a common operational adjustment parameter (e.g., bias voltage) applied simultaneously to both sets of delay lines. In accordance with a second embodiment of the invention, this delay correlation requirement is effectively obviated by forming the PWM pulse generator as an open-loop 'pseudo PLL' type architecture, diagrammatically illustrated in FIG. 5.

As shown therein, the Integer PWM Pulse is provided to an input terminal 501 applied to the input of a first inverter INV1-1 of a first delay stage 500-1 of a multistage tapped delay line 500. As noted previously, as an open loop configuration, no delay stage of the delay line 500 has its output fed back to the delay line's input stage 500-1. The stages N of the tapped delay line 500 determine the resolution, or granularity, to which the system clock signal CLOCK will be (binarily) divided and nominally encompasses one cycle of the system clock signal CLOCK. The Integer PWM Pulse is also applied to the input 551 of a delay register 550. The delay register 550 applies a single system clock cycle delay to the PWM pulse and provides this Unity Delayed Integer PWM Pulse at its output 552. The Unity Delayed Integer PWM Pulse is applied to a first input 511 of a phase detector 510. The output of the second inverter INVN-2 of the Nth delay stage 500-N is coupled to a second input 512 of the phase detector 510.

In addition to being coupled in cascade between the Integer PWM Pulse input terminal 501 and the phase detector 510, the outputs of the N delay stages 500 are coupled to respective inputs of a N:1 signal selector 530, whose output is coupled to one input of an OR gate 540. A second input of the OR gate 540 is coupled to receive the Integer PWM Pulse without any delay. As in the first embodiment, OR gate 540 will logically OR the Integer PWM Pulse applied to input terminal 501 with the output of whichever delay stage 500-j is selected in accordance with a select signal coupled to the select input 532 of signal selector 530. Thus, the output of OR gate 540 produces the PWM pulse whose leading edge is coincident with that of the Integer PWM Pulse and whose trailing edge is coincident with the trailing edge of the output of the selected delay stage.

As in the first embodiment, the output 513 of the phase detector 510 provides a phase error signal that is used to adjust the operation of each of the delay stages of the tapped delay line 500. In particular, the output 513 of the phase detector 510 is coupled to a bias voltage control unit 520, which controls the bias voltage applied to each of the delay stages of the delay line 500. In the second embodiment, however, phase detector 510 is referenced to the Integer PWM Pulse, rather than the system clock signal CLOCK, as in the first embodiment, described above. The duration of the Non-Integer PWM output pulse is thereby determined by the system clock delay granularity imparted by a respective one of the delay line stages 500-i, and from which delay line stage output the PWM pulse signal is derived.

In operation, any phase error between the Unity Delayed Integer PWM Pulse signal applied to the first input 511 of the phase detector 510 and the delayed version of the Integer PWM Pulse signal generated by delay line 500 applied at the second input 512 of phase detector 510 will cause the bias control unit 520 to adjust its output or bias voltage in a direction that adjusts the delays of the respective stages of the delay line 500 to correct for the phase error. As this bias voltage is coupled to each of the inverter pairs of the delay stages 500-1, 500-2, . . . , 500-N of the tapped delay line 500, the amount of delay imparted by each delay stage will be appropriately compensated, so that the selected fractional adjustment of the duty-cycle of the Non-Integer PWM Pulse at the output of OR gate 540 will be maintained effectively independent of processing variations and operational parameters.

As will be appreciated from the foregoing description, shortcomings of conventional schemes for generating a fractional clock pulse signal for a PWM pulse generator are effectively obviated by a tapped delay line-based mechanism, operational parameters of which are adjusted as necessary to maintain a desired fractional control of the duty-cycle the generated PWM pulse signal. In the first, phase locked loop based embodiment, the tapped delay line-based digital PWM pulse generator is augmented to include a compensating phase locked-loop formed around an auxiliary tapped delay line that implements the voltage controlled oscillator of the PLL. In the second embodiment, the PWM pulse generator is configured as an 'open-loop ' tapped delay line phase detector architecture, which avoids having to correlate the parameters of the PLL delay line with those of the PWM delay line. That is, the same delay stages that are controlled and locked by the phase detector 510 and bias control 520 impart the delay for the Integer PWM Pulse.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein, but intend to cover all such changes and modifications as are obvious to one of ordinary skill in the art.

What is claimed:

1. An apparatus comprising:
a pulse width modulation (PWM) generator which generates a PWM signal; and
a controller for controlling the operation of said PWM generator, said controller including a multistage delay line coupled to a phase detector, to which a reference signal, being either a system clock or a pulse stream constructed from integer cycles of a system clock, is coupled, said phase detector producing an output that controls an operational parameter of said multistage delay line, said multistage delay line being coupled to establish the duty-cycle of said PWM signal, wherein
said multistage delay line is configured as a closed loop circuit forming a ring oscillator of a phase locked loop (PLL) containing said phase detector, and further including a tapped delay line having a plurality of delay stages corresponding to respective delay line stages of said multistage delay line, and wherein said phase detector produces an output that controls said operational parameter of each of said multistage delay line and said tapped delay line, further including
a logical combining circuit coupled to combine a delayed output of a selected delay stage of said tapped delay line and a prescribed pulse signal applied to an input stage of said tapped delay line, and being operative to produce a fractionally extended version of said prescribed pulse signal for establishing the duty-cycle of said PWM signal.

2. The apparatus according to claim 1, wherein said operational parameter corresponds to a bias voltage for respective stages of said multistage delay line.

3. The apparatus according to claim 1, wherein said clock signal has a frequency that is a multiple of said PWM signal.

4. The apparatus according to claim 1, wherein said clock signal has a frequency corresponding to that of said PWM signal.

5. An apparatus comprising:
a pulse width modulation (PWM) generator which generates a PWM signal; and
a controller for controlling the operation of said PWM generator, said controller including a multistage delay line coupled to a phase detector to which a reference signal, being either a system clock or a pulse stream constructed from integer cycles of a system clock, is coupled, said phase detector producing an output that controls an operational parameter of said multistage delay line, said multistage delay line being coupled to establish the duty-cycle of said PWM signal, wherein said multistage delay line is configured as a closed loop circuit forming a ring oscillator of a phase locked loop (PLL) containing said phase detector, and further including a tapped delay line having a plurality of delay stages corresponding to respective delay line stages of said multistage delay line, and wherein said phase detector produces an output that controls said operational parameter of each of said multistage delay line and said tapped delay line, further including a logical combining circuit coupled to combine a delayed output of a selected delay stage of said tapped delay line and a prescribed pulse signal applied to an input stage of said tapped delay line, and being operative to produce a fractionally extended version of said prescribed pulse signal for establishing the duty-cycle of said PWM signal, further including a DC-DC converter that is controlled in accordance with said PWM signal, said DC-DC converter being coupled to receive a supply voltage, and being operative to generate a regulated output voltage derived from said supply voltage, said DC-DC converter including a switching circuit containing electronic power switching devices, that are coupled between respective power supply terminals, and are controllably switched in accordance with said PWM signal, and having a common node thereof coupled to an output voltage terminal providing said regulated output voltage.

6. A method comprising the steps of:
(a) generating a pulse width modulation (PWM) signal; and
(b) controlling the generation of said PWM signal by a multistage delay line and a phase detector to which a reference signal, being either a system clock or a pulse stream constructed from integer cycles of a system clock, is coupled, said phase detector producing an output that controls an operational parameter of said multistage delay line, said multistage delay line being coupled to establish the duty-cycle of said PWM signal, wherein said multistage delay line is configured as a closed loop circuit forming a ring oscillator of a phase locked loop (PLL) containing said phase detector, and wherein step (b) comprises providing a tapped delay line having a plurality of delay stages corresponding to respective delay line stages of said multistage delay line, and controlling said operational parameter of each of said multistage delay line and said tapped delay line in accordance with an output of said phase detector, and wherein step (b) further comprises logically combining a delayed output of a selected delay stage of said tapped delay line and a prescribed pulse signal applied to an input stage of said tapped delay line, to produce a fractionally extended version of said prescribed pulse signal for establishing the duty-cycle of said PWM signal.

7. The method according to claim 6, wherein said operational parameter corresponds to a bias voltage for respective stages of said multistage delay line.

8. The method according to claim 6, wherein said clock signal has a frequency that is a multiple of said PWM signal.

9. The method according to claim 6, wherein said clock signal has a frequency corresponding to that of said PWM signal.

10. A method comprising the steps of:
(a) generating a pulse width modulation (PWM) signal; and
(b) controlling the generation of said PWM signal by a multistage delay line and a phase detector to which a reference signal, being either a system clock or a pulse stream constructed from integer cycles of a system clock, is coupled, said phase detector producing an output that controls an operational parameter of said multistage delay line, said multistage delay line being coupled to establish the duty-cycle of said PWM signal, wherein said multistage delay line is configured as a closed loop circuit forming a ring oscillator of a phase locked loop (PLL) containing said Phase detector, and wherein step (b) comprises providing a tapped delay line having a plurality of delay stages corresponding to respective delay line stages of said multistage delay line, and controlling said operational parameter of each of said multistage delay line and said tapped delay line in accordance with an output of said phase detector, and wherein step (b) further comprises logically combining a delayed output of a selected delay stage of said tapped delay line and a prescribed pulse signal applied to an input stage of said tapped delay line, to produce a fractionally extended version of said prescribed pulse signal for establishing the duty-cycle of said PWM signal, further including the step of:

(c) controlling a DC-DC converter in accordance with said PWM signal, said DC-DC converter being coupled to receive a supply voltage, and being operative to generate a regulated output voltage derived from said supply voltage, said DC-DC converter including a switching circuit containing electronic power switching devices, that are coupled between respective power supply terminals, and are controllably switched in accordance with said PWM signal, and having a common node thereof coupled to an output voltage terminal providing said regulated output voltage.

11. A method comprising the steps of:
(a) coupling a pulse signal for defining a pulse width modulation (PWM) signal to a multistage delay line that is coupled with a phase detector;
(b) controlling an operational parameter of said multistage delay line in accordance with an output of said phase detector; and
(c) establishing the duty-cycle of said PWM signal in accordance with a delayed version of said pulse signal as produced by a selected stage of said multistage delay line, wherein said multistage delay line is configured as a closed loop circuit forming a ring oscillator of a phase locked loop (PLL) containing said phase detector, and wherein step (c) comprises providing a tapped delay line having a plurality of delay stages corresponding to respective delay line stages of said multistage delay line, and controlling said operational parameter of each of said multistage delay line and said tapped delay line in accordance with an output of said phase detector, so as to establish said duty-cycle of said PWM signal, and wherein step (c) further comprises logically combining a delayed output of a selected delay stage of said tapped delay line and a prescribed pulse signal applied to an input stage of said tapped delay line, to produce a fractionally extended version of said prescribed pulse signal for establishing the duty-cycle of said PWM signal.

12. A method comprising the steps of:
(a) coupling a pulse signal for defining a pulse width modulation (PWM) signal to a multistage delay line that is coupled with a phase detector;
(b) controlling an operational parameter of said multistage delay line in accordance with an output of said phase detector; and
(c) establishing the duty-cycle of said PWM signal in accordance with a delayed version of said pulse signal as produced by a selected stage of said multistage delay line, wherein said multistage delay line is configured as a closed loop circuit forming a ring oscillator of a phase locked loop (PLL) containing said phase detector, and wherein step (c) comprises providing a tapped delay line having a plurality of delay stages corresponding to respective delay line stages of said multistage delay line, and controlling said operational parameter of each of said multistage delay line and said tapped delay line in accordance with an output of said phase detector, so as to establish said duty-cycle of said PWM signal, and wherein step (c) further comprises logically combining a delayed output of a selected delay stage of said tapped delay line and a prescribed pulse signal applied to an input stage of said tapped delay line, to produce a fractionally extended version of said prescribed pulse signal for establishing the duty-cycle of said PWM signal, further including the step of:

(d) controlling a DC-DC converter in accordance with said PWM signal, said DC-DC converter being coupled to receive a supply voltage, and being operative to generate a regulated output voltage derived from said supply voltage, said DC-DC converter including a switching circuit containing electronic power switching devices, that are coupled between respective power supply terminals, and are controllably switched in accordance with said PWM signal, and having a common node thereof coupled to an output voltage terminal providing said regulated output voltage.

* * * * *